(12) United States Patent
Ishizawa et al.

(10) Patent No.: US 11,610,723 B2
(45) Date of Patent: Mar. 21, 2023

(54) TRANSFORMER, POWER SUPPLY, AND MEDICAL SYSTEM

(71) Applicant: TDK CORPORATION, Tokyo (JP)

(72) Inventors: Kazuki Ishizawa, Tokyo (JP); Ken Takayama, Tokyo (JP); Masayoshi Ono, Tokyo (JP); Jyunya Hiura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 410 days.

(21) Appl. No.: 16/814,251

(22) Filed: Mar. 10, 2020

(65) Prior Publication Data
US 2020/0294708 A1    Sep. 17, 2020

(30) Foreign Application Priority Data

Mar. 13, 2019    (JP) .............................. JP2019-045629

(51) Int. Cl.
| | |
|---|---|
| H01F 27/28 | (2006.01) |
| H05K 1/02 | (2006.01) |
| H01F 30/06 | (2006.01) |
| H02M 3/335 | (2006.01) |
| H02M 3/00 | (2006.01) |

(52) U.S. Cl.
CPC ......... *H01F 27/2804* (2013.01); *H01F 30/06* (2013.01); *H02M 3/33573* (2021.05); *H05K 1/0233* (2013.01); *H01F 2027/2819* (2013.01); *H02M 3/003* (2021.05); *H02M 3/01* (2021.05)

(58) Field of Classification Search
CPC .................. H01F 27/2804; H01F 30/06; H01F 2027/2819; H02M 3/33569; H05K 1/0233
See application file for complete search history.

(56) References Cited

U.S. PATENT DOCUMENTS

| | | | |
|---|---|---|---|
| 2010/0207714 A1* | 8/2010 | Lai | H01F 27/22 336/61 |
| 2017/0310228 A1 | 10/2017 | Nakajima et al. | |
| 2018/0069485 A1* | 3/2018 | Hsiao | H02M 3/285 |

FOREIGN PATENT DOCUMENTS

| | | |
|---|---|---|
| JP | 2011-120362 A | 6/2011 |
| JP | 2018-157756 A | 10/2018 |
| JP | 2018-160606 A | 10/2018 |

OTHER PUBLICATIONS

Japanese Notice of Reasons for Rejection (including English Language Translation), dated Nov. 15, 2022, in the corresponding Japanese Patent Application No. 2019-045629.

* cited by examiner

*Primary Examiner* — Rafael O Leon De Domenech
(74) *Attorney, Agent, or Firm* — Greenblum & Bernstein, P.L.C.

(57) ABSTRACT

A transformer includes a primary winding and a secondary winding, which are flat, and a magnetic core that has a middle leg that passes through the primary and secondary windings, a first core that is connected to one end along the length direction of the middle leg, and a second core that is connected to the other end along the length direction. A first wall surface on the side of the first core where the middle leg is positioned and a second wall surface on the side of the second core which faces the first wall surface are formed so as to be parallel, the primary winding is fixed to the first wall surface, the secondary winding is fixed to the second wall surface, and the distance between the primary winding and the secondary winding is kept constant.

19 Claims, 5 Drawing Sheets

TRANSFORMER, POWER SUPPLY, AND MEDICAL SYSTEM

FIELD OF THE INVENTION

The present invention relates to a transformer equipped with a primary winding, a secondary winding, and a core, to a power supply equipped with such transformer, and to a medical system equipped with such power supply.

DESCRIPTION OF THE RELATED ART

As one example of a transformer of this type, the transformer used in the power supply (an isolation switching power supply) disclosed in Patent Literature 1 (Japanese Laid-open Patent Publication No. 2016-165176) is known. This transformer includes: a first circuit board on which a primary winding that constructs an isolation transformer is formed as a pattern; a second circuit board on which a secondary winding that constructs the isolation transformer is formed as a pattern and is disposed so that the part where the secondary winding is formed faces the part of the first circuit board where the primary winding is formed with a predetermined gap in between; a core that is inserted through the primary winding on the first circuit board and the secondary winding on the second circuit board and is composed of a magnetic body that constructs the isolation transformer; and a gap setting member (or "spacer") that is provided between the first circuit board and the second circuit board and sets the gap between the part of the first circuit board where the primary winding is formed and the part of the second circuit board where the secondary winding is formed at the predetermined gap mentioned above.

In this transformer, by setting the gap between the primary winding on the first circuit board and the secondary winding on the second circuit board at the predetermined gap using the gap setting member, it is possible to form a leakage inductance of a desired inductance value. Also, in this transformer, since the primary winding and the secondary winding are separately provided on the first circuit board and the second circuit board, it is possible to efficiently dissipate heat generated in the transformer.

SUMMARY OF THE INVENTION

The main cause of heat generation in the transformer described above is so-called "copper loss" caused by the currents flowing through the primary winding and the secondary winding. For this reason, in the transformer described above, the primary winding and the secondary winding are separated (that is, the heat generating members are separated) so that the heat generated in each winding can efficiently dissipate. However, when a lot of heat is generated in the primary winding and the secondary winding, a configuration that merely separates the primary winding and the secondary winding will not sufficiently dissipate the heat, resulting in the problem of a large rise in the temperature of the primary winding and the secondary winding.

The present invention was conceived in view of the problems described above and has a principal object of providing a transformer that accurately separates the primary winding and the secondary winding at a constant distance and is also capable of more efficiently dissipating heat produced in the primary winding and the secondary winding. It is another principal object to provide a power supply equipped with such transformer and a medical system equipped with such power supply.

To achieve the stated object, a transformer according to the present invention comprises: a primary winding formed so as to be flat; a secondary winding formed so as to be flat; and a magnetic core including a column-shaped core that is inserted through the primary winding and the secondary winding, a first core that is connected to one end along a length direction of the column-shaped core, and a second core that is connected to another end along the length direction, wherein a wall surface on a side of the first core where the column-shaped core is positioned and a wall surface of the second core, which faces the wall surface of the first core, where the column-shaped core is positioned are formed so as to be parallel to each other, and one of the primary winding and the secondary winding is fixed to the wall surface of the first core and the other of the primary winding and the secondary winding is fixed to the wall surface of the second core, and a distance between the primary winding and the secondary winding is set at a constant distance.

This means that according to the above transformer, by using a configuration where the primary winding and the secondary winding are fixed to the wall surface of the first core and the wall surface of the second core where the distance between the primary winding and the secondary winding is the length of the column-shaped core whose manufacturing tolerance is extremely small, it is possible to set the distance between the primary winding and the secondary winding in a state where there is extremely little variation between the individual transformers being manufactured (a state where the distance between the primary winding and the secondary winding is kept constant with high precision). For this reason, it is possible to keep the inductance value of the leakage inductance, which is determined by the distance between the primary winding and the secondary winding, with high precision at a value (target value) set in advance. According to the transformer described above, since the primary winding and the secondary winding are fixed to the wall surface of the first core and the wall surface of the second core, heat produced in the primary winding and the secondary winding can be efficiently transmitted (dissipated) to the magnetic core, which makes it possible to reliably avoid a situation where there is a large rise in the temperature of the primary winding and the secondary winding.

Also, in the transformer according to the present invention, at least one out of the primary winding and the secondary winding is composed of a coil-shaped conductive pattern formed at a substrate.

By doing so, according to the above transformer, it is possible to accurately and easily form at least one of the windings so as to be flat.

Also, in the transformer according to the present invention, the primary winding and the secondary winding are fixed to the corresponding wall surfaces by adhesion using an adhesive that is thermally conductive.

By doing so, according to the above transformer, it is possible to increase the adhesion between the primary winding and secondary winding and the wall surfaces of the first core and second core using adhesive. This means that according to the above transformer, it is possible to transfer (dissipate) heat produced in the primary winding and the secondary winding to the magnetic core much more efficiently.

Also, the transformer according to the present invention further comprises a heat dissipator.

By doing so, according to the above transformer, it is possible for the heat transmitted from the primary winding and the secondary winding to the magnetic core to be efficiently transferred (dissipated) via a heat dissipator to a member, such as a circuit board, to which the transformer is fixed. With a configuration where the transformer is placed in contact with a case of the power supply or is placed in contact with a heat sink, it is possible to efficiently transmit (dissipate) the heat described above to such members placed in contact with the transformer.

A power supply according to the present invention comprises: the transformer described above; a switch that intermittently applies a direct current (DC) input voltage to the primary winding; a secondary-side rectifying and smoothing circuit that is connected to the secondary winding, rectifies and smoothes an alternating current (AC) voltage generated in the secondary winding, and outputs a DC output voltage; and a controller that controls operation of the switch based on the DC output voltage.

By doing so, according to the above power supply, it is possible to achieve the same effects as the transformer alone described above.

A medical system according to the present invention comprises: the power supply described above further including a pair of input terminals connected to an input line, a primary-side rectifying and smoothing circuit that is connected via a pair of power supply lines to the pair of input terminals, rectifies and smoothes an AC voltage inputted via the input line, the pair of input terminals, and the pair of power supply lines, and outputs to the switch as the DC input voltage, and a fuse or breaker interposed on the pair of power supply lines; and a medical appliance that is connected downstream of the power supply and operates based on the DC output voltage from the power supply.

Therefore, according to the above medical system where the power supply includes the transformer that has reinforced insulation, since the power supply further includes the fuse or breaker on the pair of power supply lines, the power supply is configured so as to be capable of meeting medical standards by itself. This means that it is possible to realize a configuration capable of meeting medical standards without an isolation transformer or a fuse (or breaker) being interposed outside the power supply (in more detail, on the input lines connected to the power supply). Also, according to the above medical system, by including the power supply described above, it is possible to achieve the same effects as the power supply alone described above.

A medical system according to the present invention comprises: the above power supply further including a pair of input terminals connected to an input line and a primary-side rectifying and smoothing circuit that is connected to the pair of input terminals, rectifies and smoothes an AC voltage inputted via the input line and the pair of input terminals, and outputs as the DC input voltage to the switch; a fuse or breaker interposed on the input line; and a medical appliance that is connected downstream of the power supply and operates based on the DC output voltage from the power supply.

Therefore, according to the above medical system where the power supply includes the transformer that has reinforced insulation, it is possible to realize a configuration capable of meeting medical standards by merely interposing the fuse (or breaker) outside the power supply (in more detail, on the input lines connected to the power supply). Also, according to the medical system, by including the power supply, it is possible to achieve the same effects as the power supply alone described above.

A medical system according to the present invention comprises: the above power supply further including a pair of input terminals connected to an input line, a primary-side rectifying and smoothing circuit that is connected to the pair of input terminals via a pair of power supply lines, rectifies and smoothes an AC voltage inputted via the input line, the pair of input terminals, and the pair of power supply lines and outputs as the DC input voltage to the switch, and a first fuse or first breaker interposed on one power supply line out of the pair of power supply lines; a second fuse or second breaker interposed on the input line connected via the input terminal to another power supply line out of the pair of power supply lines; and a medical appliance that is connected downstream of the power supply and operates based on the DC output voltage from the power supply.

Therefore, according to the above medical system where the power supply includes the transformer that has reinforced insulation, since the power supply further internally includes the first fuse or first breaker interposed on one power supply line, by merely interposing the second fuse or second breaker outside the power supply (more specifically, on the input line connected to the other power supply line out of the input lines connected to the power supply), it is possible to realize a configuration capable of meeting medical standards. Also, according to the medical system, by including the power supply, it is possible to achieve the same effects as the power supply alone described above.

That is, according to the transformer and the power supply according to the present invention, it is possible to more efficiently transmit (dissipate) heat produced in the primary winding and the secondary winding to the magnetic core while accurately keeping the primary winding and the secondary winding the constant distance apart in the transformer. Also, according to the medical system according to the present invention, by including the power supply described above, it is possible to meet medical standards while achieving the above effects of the power supply alone.

It should be noted that the disclosure of the present invention relates to the contents of Japanese Patent Application No. 2019-045629 that was filed on Mar. 13, 2019, the entire contents of which are herein incorporated by reference.

BRIEF DESCRIPTION OF THP DRAWINGS

These and other objects and features of the present invention will be explained in more detail below with reference to the attached drawings, wherein.

DESCRIPTION OF THE PREFERRED EMBODIMENTS

Preferred embodiments of a transformer, a power supply, and a medical system will now be described with reference to the attached drawings.

Figure 1:
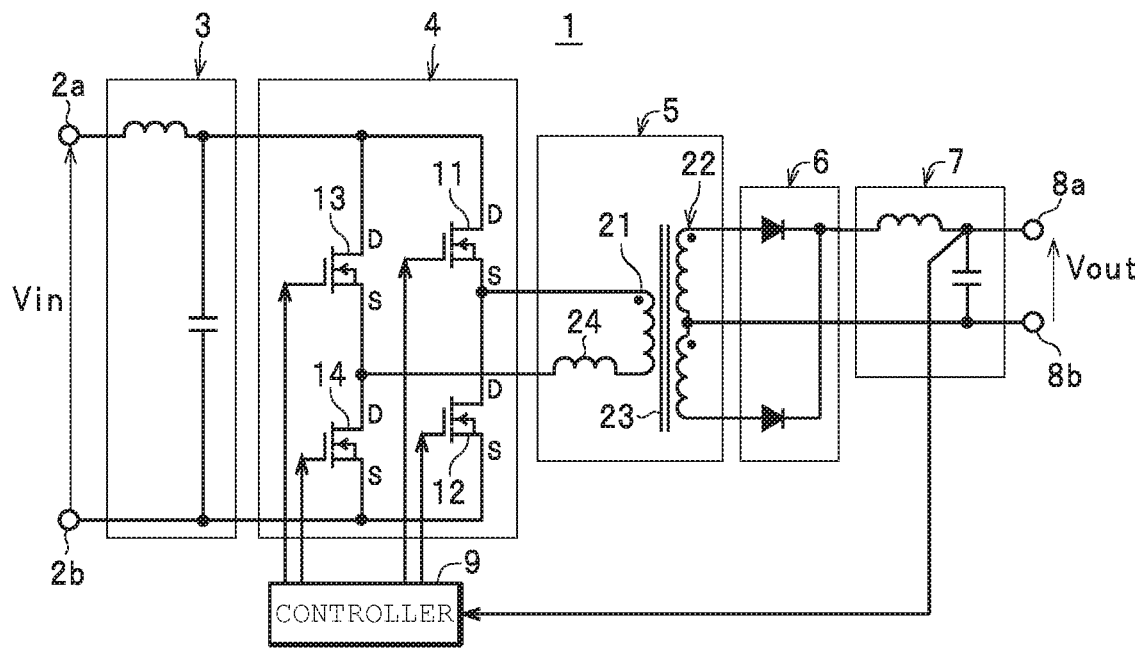
FIG. 1 is a diagram depicting a power supply equipped with a transformer.

First, the configuration of a power supply 1 as one example of a "power supply" according to the present invention and the configuration of a transformer 5 as one example of a "transformer" according to the present invention will be described together while referring to the drawings. As one example, as depicted in FIG. 1, the power supply 1 includes a pair of input terminals 2a and 2b (hereinafter referred to as the "input terminals 2" when no particular distinction is made between them), a primary-side smoothing circuit 3, a switch 4, the transformer 5, a rectifier 6, a secondary-side smoothing circuit 7, and a pair of output terminals 8a and 8b (hereinafter referred to as the "output terminals 8" when no particular distinction is made between them). The power supply 1 generates a direct current (DC) output voltage Vout based on a DC input voltage yin inputted across the input terminals 2a and 2b (a DC voltage such that the potential or the input terminal 2a is high with the potential at the input terminal 2b as a reference) and outputs across the output terminals 8a and 8b (in a state where the potential of the output terminal 8a is high with the potential at the output terminal 8b as a reference). The power supply 1 is also equipped with a controller 9 that executes switching control over the individual switching elements that construct the switch 4 (as one example in FIG. 1, the four switching elements described later) based on the DC output voltage Vout to keep the DC output voltage constant.

As one example, the primary-side smoothing circuit 3 and the secondary-side smoothing circuit 7 are configured to include an inductor and a capacitor. Alternatively, a configuration that includes only a capacitor may be used. Together with the rectifier 6, the secondary-side smoothing circuit 7 constructs a secondary-side rectifying and smoothing circuit. When the DC input voltage Vin has a stable voltage value and/or the included high-frequency noise component is sufficiently small, the primary-side smoothing circuit 3 may be omitted. There are also no particular limitations on the configuration for inputting the DC input voltage Vin across the input terminals 2a and 2b. As one example, although not illustrated, it is possible to connect the input terminals 2a and 2b to a pair of input lines on which an alternating current (AC) voltage is supplied. In this case, although not illustrated, a rectifier (which together with the primary-side smoothing circuit 3 constructs a primary-side rectifying and smoothing circuit) is disposed between the input terminals 2a and 2b and the primary-side smoothing circuit 3, the DC input voltage Vin is generated from the AC voltage by this primary-side rectifying and smoothing circuit, and the DC input voltage Vin is then outputted to the switch 4 as a DC input voltage. Note that it should be obvious that a configuration including a power factor correction circuit (or "PFC circuit") may be used for the primary-side rectifying and smoothing circuit.

The switch 4 has a configuration including one or two or more switching elements, is disposed between the input terminals 2 and a primary winding 21, described later, of the transformer 5, and intermittently applies the DC input voltage Vin as a DC voltage to the primary winding 21 via a switching operation by the switching element(s). As examples of the switching element(s), it is possible to use various semiconductor switches, such as MOSFETs (field effect transistors) and bipolar transistors.

Here, as one example in the present embodiment, as depicted in FIG. 1, the switch 4 uses a full-bridge circuit configuration including four switching elements (as one example, the four switching elements 11, 12, 13, and 14 that are constructed of n channel MOSFETs). However, the switch 4 is not limited to this circuit configuration. Although not illustrated, it is also possible to use a variety of circuit configurations, such as a single-ended forward configuration, a push-pull configuration, or a half-bridge configuration.

As depicted in FIG. 1, the transformer 5 includes the primary winding 21, a secondary winding 22, and a shared magnetic core 23 that magnetically couples the primary winding 21 and the secondary winding 22. In the power supply 1, a circuit configuration that uses the leakage inductance 24 of the transformer 5 is used. A variety of circuit configurations that use the leakage inductance 24 are known, such as a circuit configuration that uses the leakage inductance 24 in place of a separate reactor that would be connected in series to the primary winding 21 and a circuit configuration that causes soft switching of the switching elements 11, 12, 13, and 14 in the switch 4 using the leakage inductance 24. As one example in the present embodiment, it is assumed here that a circuit configuration that uses the leakage inductance 24 to enable soft switching of the switching elements 11, 12, 13, and 14 is used.

Here, to appropriately enable soft switching of the switching elements 11, 12, 13, and 14, it is necessary to set the inductance value of the leakage inductance 24 at a value set in advance (or "target value": a value in a target range set in advance). It is also necessary to match the inductance value of each transformer 5 being manufactured to this target value with as little variation as possible. The leakage inductance 24 is mainly formed by separately winding (disposing) the primary winding 21 and the secondary winding 22 around the magnetic core 23. In this case, the inductance value is set by the distance (gap) between the primary winding 21 and the secondary winding 22. For this reason, in the transformer 5 according to the present embodiment, the construction described below is used so that the distance between the primary winding 21 and the secondary winding 22 can be kept constant with high precision for each transformer 5 being manufactured (which results in the inductance value of the leakage inductance 24 being kept constant with high precision).

The construction of the transformer 5 will now be described in detail.

As one example in the present embodiment, as depicted in FIGS. 2 to 5, the magnetic core 23 is constructed by combining a pair of magnetic cores 23a and 23b that are both formed in an "E" shape. That is, the magnetic core 23 is composed of an EE-shaped core. Note that the magnetic core 23 is not limited to an EE-shaped core and although not illustrated, the magnetic core 23 may be composed of a core of another commercially available shape (such as an EI-shaped core, an EER-shaped core, a PQ-shaped core, or an ER-shaped core) which is then used in the same way as the EE-shaped core.

When a core of any the shapes described above is used, as depicted in FIGS. 4 and 5, the magnetic core 23 includes a column-shaped core 31 (a core in the shape of a square column or a circular column, hereinafter the "middle leg 31") on which the primary winding 21 and the secondary winding 22 are disposed (in other words, a core that is inserted through the primary winding 21 and the secondary winding 22), side legs 32 and 33 in the form of a pair of columns (in the present embodiment, in the form of rectangular solids) with the same length as the middle leg 31 (the length along the up-down direction in FIGS. 4 and 5), a first core 34 in the form of a plate (a rectangular solid in the present embodiment) of a uniform thickness that is connected to one end (in FIGS. 4 and 5, the upper end) along the length direction (the up-down direction in FIGS. 4 and 5) of each of the legs 31, 32, and 33, and a second core 35 in the form of a plate (a rectangular solid in the present embodiment) of a uniform thickness that is connected to the other end (in FIGS. 4 and 5, the lower end) along the length direction of each of the legs 31, 32, and 33.

Figure 2:
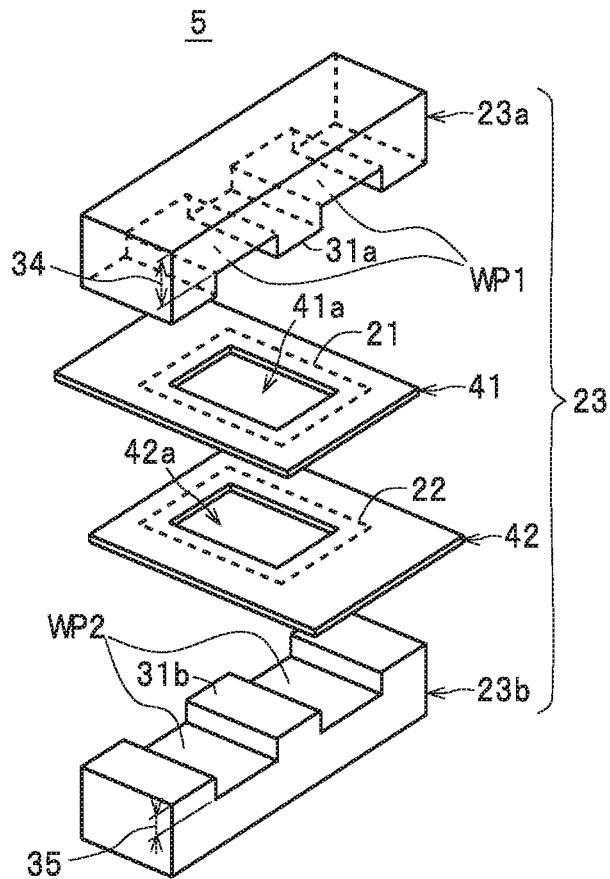
FIG. 2 is an exploded perspective view useful in explaining the configuration of the transformer.
Figure 5:
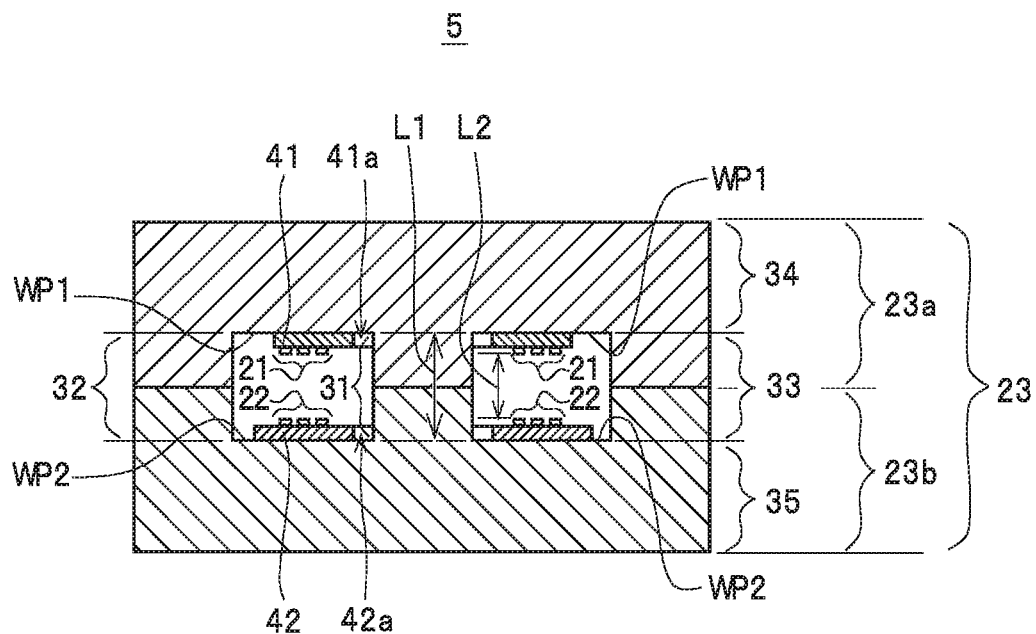
FIG. 5 is a cross-sectional view taken along a line W-W in FIG. 4.

Facing side walls of the first core 34, which is connected to one end of the legs 31, 32, and 33 that are formed with the same length, and the second core 35, which is connected to the other end (that is, the wall surface WP1 on the middle leg 31-side of the first core 34 and the wall surface WP2 on the middle leg 31-side of the second core 35, see FIGS. 2 and 5) are formed so as to be parallel (in more detail, as flat surfaces that are parallel with each other).

Each of the commercially available core shapes is normally manufactured with extremely small manufacturing tolerances. This means that extremely small variation (as one example, within a range of ±0.3 mm with respect to the standard dimension) is maintained for the length L1 of the legs 31, 32, and 33 (that is the distance L1 between the wall surfaces WP1 and WP2, see FIG. 5).

Figure 3:
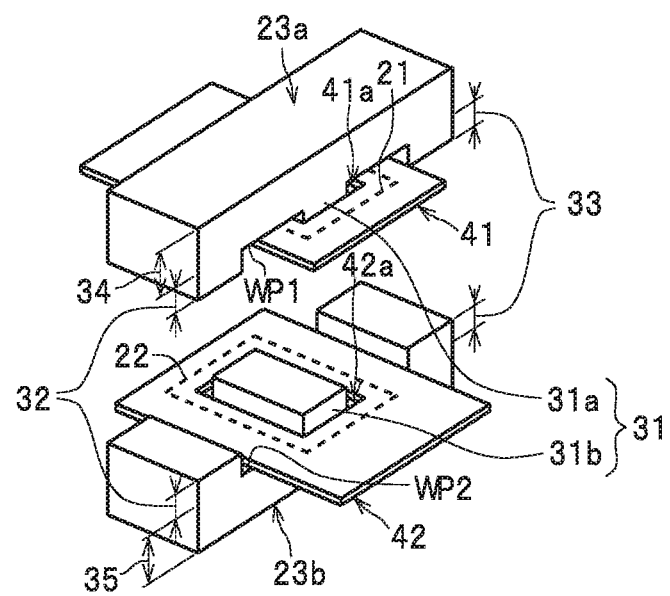
FIG. 3 is a partially exploded perspective view useful in explaining the configuration of the transformer.
Figure 4:
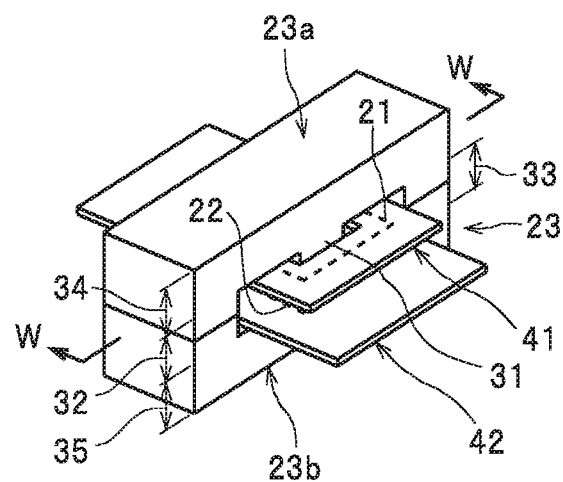
FIG. 4 is a perspective view useful in explaining the configuration of the transformer.

Also, as depicted in FIGS. 2, 3, and 4, as one example the primary winding 21 is composed of a coil-shaped conductive pattern formed on the circuit board 41 and the secondary winding 22 is composed of a coil-shaped conductive pattern formed on a circuit board 42. Note that although the secondary winding 22 is configured to include a center tap as depicted in FIG. 1 as one example in the present embodiment, although not illustrated, the secondary winding 22 may be configured to not include a center tap. The circuit boards 41 and 42 are formed of flat plates of uniform thickness using an insulating resin material, such as glass epoxy.

A through-hole 41a through which the middle leg 31 of the magnetic core 23 is inserted is formed in the circuit board 41 and the primary winding 21 is formed as a coil that surrounds the through-hole 41a. A through-hole 42a through which the middle leg 31 of the magnetic core 23 is inserted is formed in the circuit board 42 and the secondary winding 22 is formed as a coil that surrounds the through-hole 42a.

When the circuit boards 41 and 42 are multilayer substrates, the primary winding 21 and the secondary winding 22 are formed in an internal layer or on one surface of the substrates. When the circuit boards 41 and 42 are single-layer substrates, the primary winding 21 and the secondary winding 22 are formed on one surface of the substrates. With this configuration, that is, the primary winding 21 and the secondary winding 22 are formed at the substrates, the primary winding 21 and the secondary winding 22 are respectively formed so as to be flat that are parallel to the surfaces of the corresponding circuit boards 41 and 42.

Also, as depicted in FIGS. 3, 4, and 5, the circuit board 41 is fixed to one magnetic core 23a in a state where a leg portion 31a of one magnetic core 23a (that is, the part of the magnetic core 23a that constructs the middle leg 31) has been passed through the through-hole 41a of the circuit board 41 and the part of the first core 34-side surface (the upper surface in FIGS. 3, 4, and 5) of the circuit board 41 that faces the wall surface WP1 is tightly attached to the wall surface WP1. Here, although a configuration may be used where the primary winding 21 formed on the circuit board 41 is in direct contact with the wall surface WP1 of the first core 34, such configuration where the primary winding 21 comes into direct contact with the first core 34 has the risk of damage to the primary winding 21 during fixing. To avoid this, it is preferable to use a configuration where the primary winding 21 is fixed to the magnetic core 23a in a state where the primary winding 21 does not directly contact the first core 34. In more detail, when the circuit board 41 is a single-layer or a multilayer circuit board and the primary winding 21 is formed on one surface of the circuit board, it is preferable to use a configuration where fixing is performed with the other surface of the circuit board 41 in tight contact with the wall surface WP1 of the first core 34. Note that when the circuit board 41 is a multilayer circuit board and the primary wincing 21 is formed in an internal layer, at is possible to perform fixing with either surface of the circuit board 41 in tight attachment with the wall surface WP1.

Also, as depicted in FIGS. 3, 4, and 5, the circuit board 42 is fixed to the magnetic core 23b in a state where a leg portion 31b of the other magnetic core 23b (that is, the part of the magnetic core 23b that constructs the middle leg 31) has been passed through the through-hole 42a of the circuit board 42 and the part of the second core 35-side surface (the lower surface in FIGS. 3, 4, and 5) of the circuit board 42 that faces the wall surface WP2 is tightly attached to the wall surface WP2. Here, although a configuration may be used where the secondary winding 22 formed on the circuit board 42 is in direct contact with the wall surface WP2 of the second core 35, such configuration where the secondary winding 22 comes into direct contact with the second core 35 has the risk of damage to the secondary winding 22 during fixing. To avoid this, it is preferable to use a configuration where the secondary winding 22 is fixed to the magnetic core 23b in a state where the secondary winding 22 does not directly contact the second core 35. In more detail, when the circuit board 42 is a single-layer or a multilayer circuit board and the secondary winding 22 is formed or one surface of the circuit board, it is preferable to use a configuration where fixing is performed with the other surface of the circuit board 42 in tight contact with the wall surface WP2 of the second core 35. Note that when the circuit board 42 is a multilayer circuit board and the secondary winding 22 is formed in an internal layer, it is possible to perform fixing with either surface of the circuit board 42 in tight attachment with the wall surface WP2.

Note that for ease of explaining the present embodiment, as depicted in FIG. 5, it is assumed here that the primary winding 21 is formed on one surface (the lower surface in FIG. 5) of the circuit board 41 and the circuit board 41 is fixed with the other surface (the upper surface in FIG. 5) in tight contact with the wall surface WP1 of the first core 34. It is also assumed that the secondary winding 22 is formed on one surface (the upper surface in FIG. 5) of the circuit board 42 and the circuit board 42 is fixed with the other surface (the lower surface in FIG. 5) in tight contact with the wall surface WP2 of the second core 35.

A configuration that fixes using adhesive (not illustrated) is used when fixing the circuit board 41 tightly attached to the first core 34 and the circuit board 42 tightly attached to the second core 35. Here, to enable the heat generated (that is, heat generated due to copper loss) in the primary winding 21 formed on the circuit board 41 and the secondary winding 22 formed on the circuit board 42 to be efficiently transmitted to the corresponding cores 34 and 35 (that is, the corresponding magnetic cores 23a and 23b), or in other words, to enable efficient heat dissipation from the primary winding 21 and the secondary winding 22, it is preferable to use an adhesive composed of a material with favorable thermal conductivity (that is, a thermally conductive adhesive with high thermal conductivity).

The transformer 5 is constructed by combining the magnetic core 23a, to which the circuit board 41 is fixed, and the magnetic core 23b, to which the circuit board 42 is fixed, as depicted in FIGS. 4 and 5.

It is normally possible to manufacture the circuit boards 41 and 42 with high dimensional precision. It is also possible to manufacture the circuit boards 41 and 42 with a highly precise thickness. This, together with extremely small variation being maintained for the length L1 of the legs 31, 32, and 33 of the magnetic core 23 as described above (which is also the distance L1 between the wall surfaces WP1 and WP2, see FIG. 5) means that for the transformer 5, there is extremely small variation in the distance (gap) L2 (see FIG. 5) between the primary winding 21 and the secondary winding 22 between individual transformers 5 being manufactured (a state where the distance L2 is kept constant with high precision).

Note that the primary winding 21 and the secondary winding 22 are not limited to being constructed of coil-shaped conductive patterns formed on the circuit boards 41 and 42. As one example, although not illustrated, at least one of the primary winding 21 and the secondary winding 22 may be produced by winding a copper-wire covered in an insulating covering into a coil on a flat plane with a constant thickness and fixing using varnish or the like to produce a winding in an overall flat form. Also, although not illustrated, one or both windings may be a winding formed by a conductive plate (metal plate) that is provided with end portions by forming an opening in part of a ring-shaped body in the form of a flat plate and providing connection portions at the end portions (that is, connection portions that are connected to the switch 4 or the rectifier 6).

Together with the secondary-side smoothing circuit 7, the rectifier 6 constructs a secondary-side rectifying and smoothing circuit. The rectifier 6 rectifies the AC voltage induced in the secondary winding 22 to convert to a pulsating voltage, and outputs to the secondary-side smoothing circuit 7. As one example in the present embodiment, the rectifier 6 is constructed of two rectifying elements (in more detail, diodes), and rectifies (with full-wave rectification) the AC voltage induced across both ends of the secondary winding 22 with the center tap of the secondary winding 22 as a reference. Note that the rectifier 6 is not limited to being constructed of two rectifying elements. As examples, the rectifier 6 can use a variety of configurations corresponding to the configuration of the secondary winding 22, such as a configuration that performs half-wave rectification using one rectifying element or a configuration that performs full-wave rectification with four rectifying elements (rectifying elements that construct a full bridge).

The power supply 1 described above is constructed by mounting the pair of input terminals 2a and 2b, the primary-side smoothing circuit 3, the switch 4, the transformer 5, the rectifier 6, the secondary-side smoothing circuit 7, and the pair of output terminals 8a and 8b on a circuit board. It is also preferable for the transformer 5 to be configured so as to include a heat dissipator so that heat to be transferred from the primary winding 21 and the secondary winding 22 to the corresponding magnetic cores 23a and 23b can be more efficiently transferred toward the circuit boards. As the heat dissipator, as one example, it is possible to use a thermally conductive sheet 51 as depicted in FIG. 6.

Figure 6:
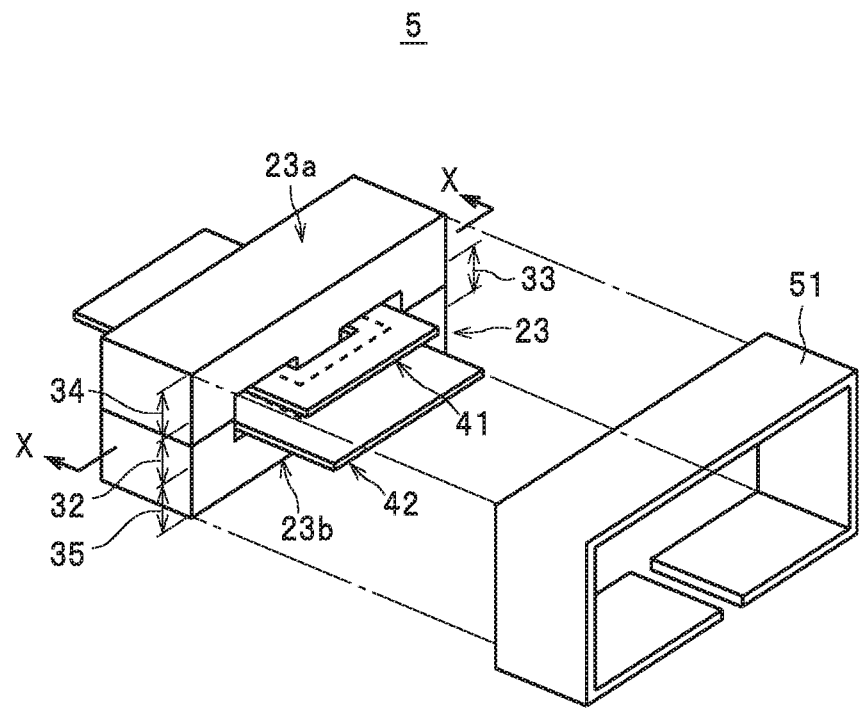
FIG. 6 is a partially exploded perspective view useful in explaining a transformer equipped with a thermally conductive sheet as a heat dissipator.
Figure 7:
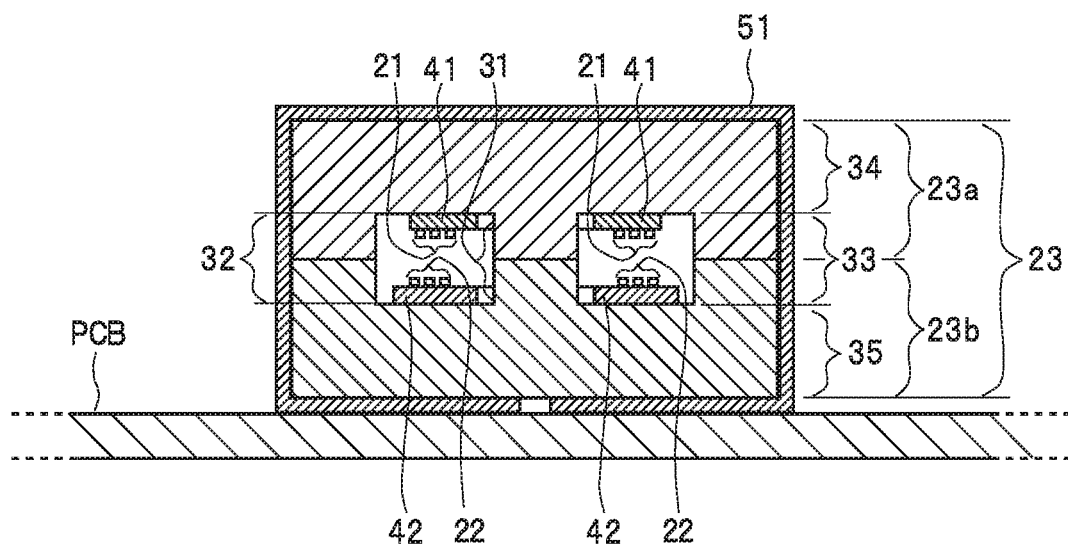
FIG. 7 is a cross-sectional view along a line X-X of a state where the transformer has been mounted on a circuit board in FIG. 6.

The transformer 5 has the thermally conductive sheet 51 wound and attached around the outer wall surfaces of the legs 32 and 33 and the cores 34 and 35 as depicted in FIG. 6, and is mounted on a circuit board PCB in a state where the thermally conductive sheet 51 is interposed between the transformer 5 and the circuit board PCB as depicted in FIG. 7. Here, to enable favorable dissipation of heat at the circuit board PCB, it is preferable for the transformer 5 to be mounted on a solid-filled part of the circuit board PCB. By using this configuration, in the transformer 5, the heat that is transferred to the corresponding magnetic cores 23a and 23b from the primary winding 21 and the secondary winding 22 is efficiently transmitted to the circuit board PCB via the thermally conductive sheet 51. That is, for the transformer 5, favorable dissipation of heat is maintained for the primary winding 21, the secondary winding 22, and also the magnetic core 23. Note that the position where the transformer 5 is mounted is not limited to the circuit board PCB where the other component elements of the power supply 1 are mounted, and to achieve more favorable heat dissipation, although not illustrated, the position may be on an aluminum plate, a metal plate used for fixing purposes, the case of the power supply 1, or the like.

Next, the operation of the power supply 1 will be described.

In the power supply 1, in a state where the DC input voltage Vin is inputted across the input terminals 2a and 2b, the switch 4 performs a soft switching operation that intermittently applies the DC input voltage yin to the primary winding 21. By doing so, the transformer 5 induces an AC voltage in the secondary winding 22, the rectifier 6 rectifies this AC voltage to convert to a pulsating voltage, and the secondary-side smoothing circuit 7 smoothes the pulsating voltage and outputs as the DC output voltage Vout across the output terminals 8a and 8b.

In the transformer 5, since the circuit board 41 where the primary winding 21 is formed so as to be flat is fixed so as to be tightly attached to the wall surface WP1 of the first core 31 that constructs one magnetic core 23a and the circuit board 42 where the secondary winding 22 is formed so as to be flat is fixed so as to be tightly attached to the wall surface WP2 of the second core 35 that constructs the other magnetic core 23b, the distance 12 between the primary winding 21 and the secondary winding 22 is set at a length that is indicated in advance in a state with extremely little variation (that is, the distance 12 is set with high precision at a constant length that is indicated in advance). As a result, the inductance value of the leakage inductance 24 is a value (target value) that is set in advance. Accordingly, the switch 4 properly performs a soft switching operation using the leakage inductance 24 whose inductance value is accurately set at the target value. This means that a state where extremely little noise is generated in the switch 4 can be maintained.

As described above, in the transformer 5, since the circuit board 41 where the primary winding 21 is formed fixed so as to be tightly attached to the wall surface WP1 of the first core 34 that constructs one magnetic core 23a and the circuit board 42 where the secondary winding 22 is formed is fixed so as to be tightly attached to the wall surface WP2 of the second core 35 that constructs the other magnetic core 23b, the heat that is produced in the primary winding 21 and the secondary winding 22 due to copper loss is efficiently transmitted to the corresponding magnetic cores 23a and 23b. By doing so, in the power supply 1, a situation where there is a large rise in the temperature of the primary winding 21 and the secondary winding 22 is avoided.

In the power supply 1, since the transformer 5 is mounted on the circuit board PCB in a state where the thermally conductive sheet 51 is interposed between the magnetic core 23 and the circuit board PCB, the heat that has been transmitted from the primary winding 21 and the secondary winding 22 to the magnetic core 23 is efficiently transferred via the thermally conductive sheet 51 to the circuit board PCB. By doing so, in the power supply 1, a situation where there is a large rise in the temperature of the entire transformer 5 is avoided.

In this way, the transformer 5 is equipped with the magnetic core 23 that includes the middle leg 31 that is inserted through the primary winding 21 and the secondary winding 22 that are formed so as to be flat, the first core 34 that is connected to one end along the length direction of the middle leg 31, and the second core 35 that is connected to the other end along the length direction of the middle leg 31, the primary winding 21 is fixed to the wall surface WP1 of the first core 34, the secondary winding 22 is fixed to the wall surface WP2 (a wall surface that is parallel to the wall surface WP1) of the second core 35, and the distance 12 between the primary winding 21 and the secondary winding 22 is set so as to be constant.

Here, as described above, a commercially available core used as the magnetic core 23 is manufactured in a state where there extremely small manufacturing tolerances, including the length L1 of the middle leg 31. This means that according to the transformer 5 and the power supply 1, by using a configuration where the primary winding 21 and the secondary winding 22 are fixed to the wall surfaces WP1 and WP2 of the magnetic core 23 where the distance L1 between the primary winding 21 and the secondary winding 22 is the length L1 of the middle leg 31 whose manufacturing tolerance is extremely small, it is possible to set the distance (gap) 12 between the primary winding 21 and the secondary winding 22 in a state where there is extremely little variation between the individual transformers 5 being manufactured (a state where the distance 12 is kept constant with high precision). For this reason, it is possible to keep the inductance value of the leakage inductance 24, which is determined by the distance (gap) L2 between the primary winding 21 and the secondary winding 22, with high precision at a value (target value) set in advance.

According to the transformer 5 and the power supply 1 described above, since the primary winding 21 and the secondary winding 22 are fixed to the respective wall surfaces WP1 and WP2 of the magnetic core 23 (that is, fixed in tight attachment), heat produced in the primary winding 21 and the secondary winding 22 can be efficiently transmitted (dissipated) to the magnetic core 23, which makes it possible to reliably avoid a situation where there is a large rise in the temperature of the primary winding 21 and the secondary winding 22.

Also, according to the transformer 5 and the power supply 1, by constructing both the primary winding 21 and the secondary winding 22 of coil-shaped conductive patterns formed on the circuit boards 41 and 42, it is possible to form the primary winding 21 and the secondary winding 22 accurately and easily in the flat form. Note that it should be obvious that it is also possible to use a configuration where only one of the primary winding 21 and the secondary winding 22 is composed of a coil-shaped conductive pattern formed on the circuit boards.

Also, according to the transformer 5 and the power supply 1, since a configuration is used where the primary winding 21 and the secondary winding 22 are fixed by adhesion to the corresponding wall surfaces WP1 and WP2 of the magnetic core 23 using adhesive that is thermally conductive, it is possible to improve the tightness of the contact between the wall surface WP1 and the primary winding 21 (more precisely, the circuit board 41) and the contact between the wall surface WP2 and the secondary winding 22 (more precisely, the circuit board 42) through the use of the adhesive. This means that according to the transformer 5 and the power supply 1, it is possible for heat produced in the primary winding 21 and the secondary winding 22 to be transmitted (dissipated) to the magnetic core 23 much more efficiently.

According to the transformer 5 and the power supply 1, since the transformer 5 includes the thermally conductive sheet 51 as a heat dissipator and is mounted on the circuit board PCB via the thermally conductive sheet 51, the heat transmitted from the primary winding 21 and the secondary winding 22 to the corresponding magnetic cores 23a and 23b can be efficiently transferred (dissipated) to the circuit board PCB via the thermally conductive sheet 51.

Note that although a case where a magnetic core with a middle leg, like an EE-shaped core, is used as the magnetic core 23 has been described above as an example, it is also possible to use a magnetic core that does not have a middle leg, such as a UU-shaped core or a UI-shaped core. Although not illustrated, when using this magnetic core, the transformer is constructed by using at least one of the side legs out of the pair of side legs as the column-shaped core.

It is possible to use this power supply 1 in a medical system by connecting the output terminals 8a and 8b to a medical appliance that operates based on the DC output voltage Vout.

Figure 8:
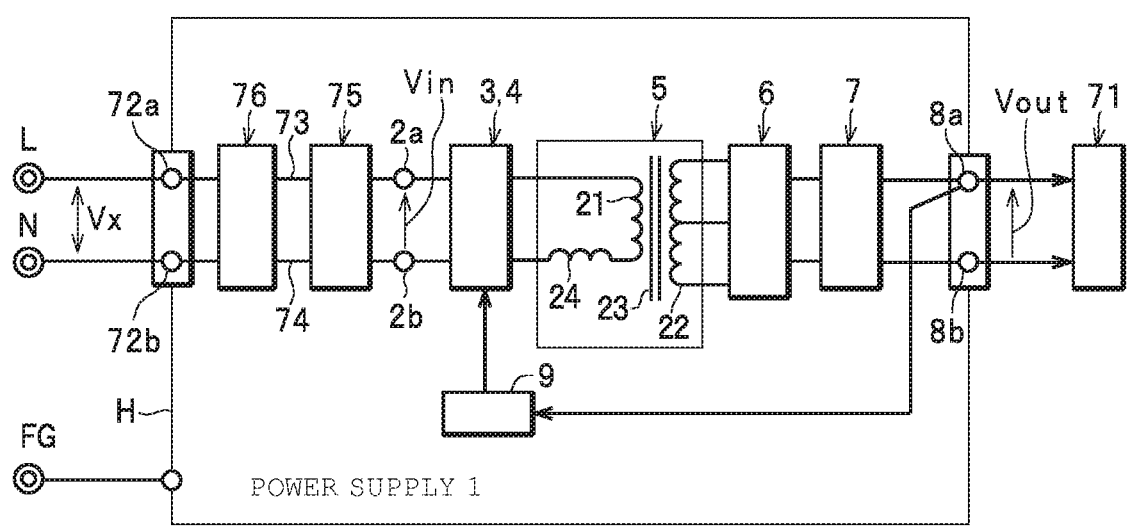
FIG. 8 is a diagram depicting a medical system equipped with a power supply.

A medical system MES1 equipped with the power supply 1 will now be described with reference to FIG. 8. Note that it is assumed here that the transformer 5 of the power supply 1 is sufficiently isolated to meet medical standards (that is, the transformer 5 has reinforced insulation). It is further assumed that a medical appliance 71 is connected to the output terminals 8a and 8b and that an FG line for grounding is connected to a housing H of the power supply 1. Configurations that are the same as the configurations of the power supply 1 have been assigned the same reference numerals and duplicated description is omitted.

In this system, the power supply 1 operates by inputting an AC, voltage Vx supplied across input lines (an L-phase line and an N-phase line) via a pair of AC input terminals 72a and 72b as a pair of input terminals. To do so, the power supply 1 internally includes a primary-side rectifying and smoothing circuit 75 connected via a pair of power supply lines 73 and 74 to the pair of AC input terminals 72a and 72b, and is configured so that the primary-side rectifying and smoothing circuit 75 rectifies and smoothes the AC voltage Vx inputted via the input lines L and N, the pair of AC input terminals 72a and 72b, and the pair of power supply lines 73 and 74 to generate the DC input voltage Vin and supply the DC input voltage Vin to the input terminals 2a and 2b. The primary-side rectifying and smoothing circuit 75 may be configured to include a power factor correction circuit (or "PFC circuit"). The power supply 1 also internally includes a fuse 76 (or breaker) interposed on the pair of power supply lines 73 and 74.

According to the medical system MES1 equipped with the power supply 1, the power supply 1 includes the transformer 5 that has reinforced insulation and the fuse 76 as described above and is configured so as to be capable of meeting medical standards by itself. This means that it is possible to realize a configuration capable of meeting medical standards without an isolation transformer or a fuse (or breaker) being interposed outside the power supply 1 (in more detail, on the input lines (the L-phase line and N-phase line) connected to the power supply 1). Also, according to the medical system MES1, by including the power supply 1, it is possible to achieve the same effects as the power supply 1 alone described above.

Although the power supply 1 in the medical system MES1 described above internally includes the fuse 76 (or breaker), it is also possible to configure a medical system using a power supply 1 that does not internally include the fuse 76 (or breaker). A medical system MES2 that uses this configuration will now be described with reference to FIG. 9. Note that configurations that are the same as the medical system MES1 described above have been assigned the same reference numerals and duplicated description is omitted, with the following description focusing on configurations that differ to the medical system MES1.

Figure 9:
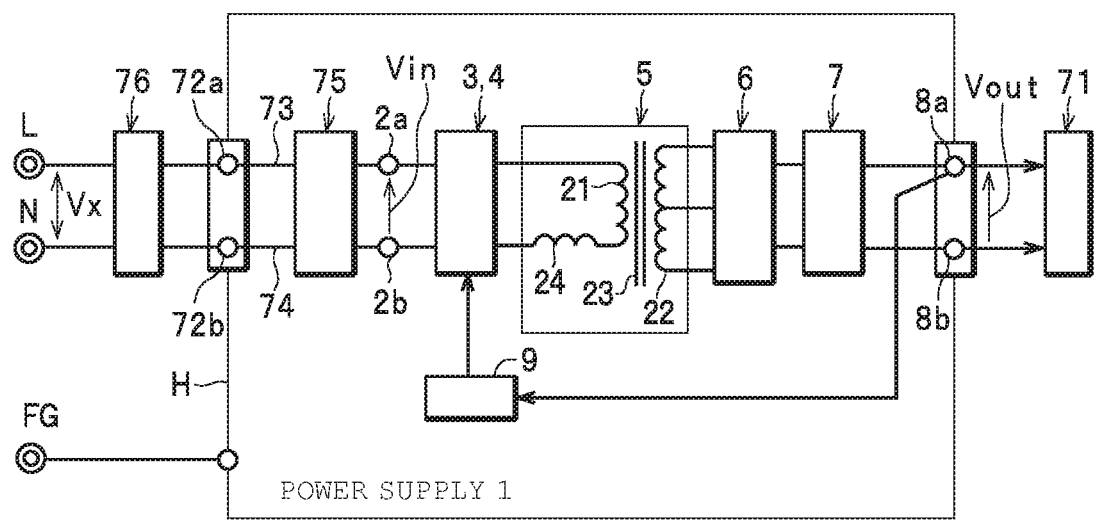
FIG. 9 is a diagram depicting another medical system equipped with a power supply.

As depicted in FIG. 9, in this medical system MES2, the fuse 76 (or breaker) is interposed on the input lines (the L-phase line and the N-phase line). With this configuration, the AC voltage Vx supplied from across the input lines (the L-phase line and the N-phase line) is inputted into the AC input terminals 72a and 72b of the power supply 1 via the fuse 76 (or breaker).

According to the medical system MES2 equipped with the power supply 1, since the power supply 1 includes the transformer 5 that has reinforced insulation as described above, it is possible to realize a configuration capable of meeting medical standards by merely interposing the fuse 76 (or breaker) outside the power supply 1 (in more detail, on the input lines (the L-phase line and N-phase line) connected to the power supply 1). Also, according to the medical system MES2, by including the power supply 1, it is possible to achieve the same effects as the power supply 1 alone described above.

Figure 10:
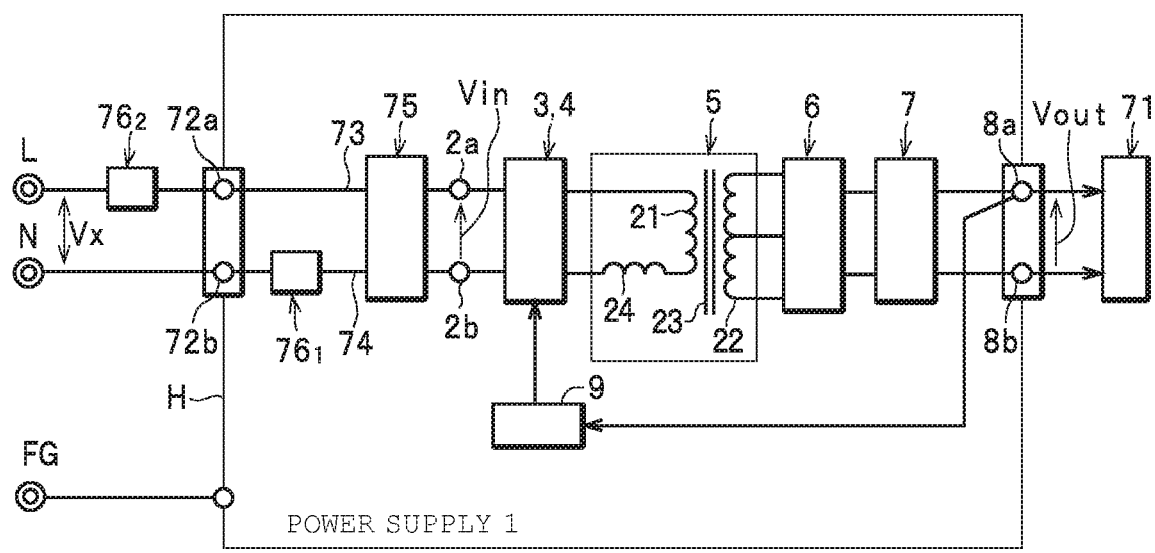
FIG. 10 is a diagram depicting another medical system equipped with a power supply.

Although the medical systems MES1 and MES2 described above are configured with the fuse 76 (or breaker) interposed only one of inside and outside the power supply 1, it is also possible to use a configuration where a fuse 76 (or breaker) is interposed both inside and outside the power supply 1. A medical system MES3 that uses this configuration will now be described with reference to FIG. 10. Note that configurations that are the same as the medical systems MES1 and MES2 described above have been assigned the same reference numerals and duplicated description is omitted, with the following description instead focusing on configurations that differ to the medical systems MES1 and MES2.

In the medical system MES3, the power supply 1 internally includes a fuse $76_1$ as a first fuse (or a breaker as a first breaker) that is interposed on one power supply line (as one example in the present embodiment, the power supply line 74) out of the pair of power supply lines 73 and 74. Additionally, a fuse $76_2$ as a second fuse (or a breaker as a second breaker) is disposed outside the power supply 1 in a state where the fuse $76_2$ is interposed on an input line (in the present embodiment, the L-phase line) connected via an input terminal (in the present embodiment, the AC input terminal 72a) to the other power supply line (as one example in the present embodiment, the power supply line 73) out of the pair of power supply lines 73 and 74. Note that although not illustrated, it is also possible to use a configuration where the fuse $76_1$ as the first fuse (or a breaker as the first breaker) is interposed on the power supply line 73 and corresponding to this, the fuse $76_2$ as the second fuse (or a breaker as the second breaker) is interposed on the N-phase line.

According to the medical system MES3 equipped with the power supply 1, since the power supply 1 internally includes the transformer 5 that has reinforced insulation as described above and the fuse $76_1$ (or breaker) interposed on one power supply line (the power supply line 74 or the power supply line 73), by merely interposing the other fuse $76_2$ (or breaker) outside the power supply 1 (more specifically, on the input line (the L-phase line or the N-phase line) connected to the other power supply line out of the input lines (the L-phase line and the N-phase line) connected to the power supply 1), it is possible to realize a configuration capable of meeting medical standards. Also, according to the medical system MES3, by including the power supply 1, it is possible to achieve the same effects as the power supply 1 alone described above.

What is claimed is:

1. A transformer, comprising:
a primary winding formed so as to be flat;
a secondary winding formed so as to be flat; and
a magnetic core including a column-shaped core that is inserted through the primary winding and the secondary winding, a first core that is connected to one end along a length direction of the column-shaped core, and a second core that is connected to another end along the length direction,
wherein a wall surface on a side of the first core where the column-shaped core is positioned and a wall surface of the second core, which faces the wall surface of the first core, where the column-shaped core is positioned are formed so as to be parallel to each other, and
one of the primary winding and the secondary winding is fixed to the wall surface of the first core and the other of the primary winding and the secondary winding is fixed to the wall surface of the second core, and a distance between the primary winding and the secondary winding is set at a constant distance.

2. The transformer according to claim 1,
wherein at least one out of the primary winding and the secondary winding is composed of a coil-shaped conductive pattern formed at a substrate.

3. The transformer according to claim 2,
wherein the primary winding and the secondary winding are fixed to the corresponding wall surfaces by adhesion using an adhesive that is thermally conductive.

4. The transformer according to claim 3, further comprising:
a heat dissipator that is wound and attached around an outer circumferential surface of the magnetic core.

5. A power supply, comprising:
the transformer according to claim 4;
a switch that intermittently applies a direct current (DC) input voltage to the primary winding;
a secondary-side rectifying and smoothing circuit that is connected to the secondary winding, rectifies and smoothes an alternating current (AC) voltage generated in the secondary winding, and outputs a DC output voltage; and
a controller that controls operation of the switch based on the DC output voltage.

6. A power supply, comprising:
the transformer according to claim 3;
a switch that intermittently applies a direct current (DC) input voltage to the primary winding;
a secondary-side rectifying and smoothing circuit that is connected to the secondary winding, rectifies and smoothes an alternating current (AC) voltage generated in the secondary winding, and outputs a DC output voltage; and a controller that controls operation of the switch based on the DC output voltage.

7. The transformer according to claim 2, further comprising:
a heat dissipator that is wound and attached around an outer circumferential surface of the magnetic core.

8. A power supply, comprising:
the transformer according to claim 7;
a switch that intermittently applies a direct current (DC) input voltage to the primary winding;
a secondary-side rectifying and smoothing circuit that is connected to the secondary winding, rectifies and smoothes an alternating current (AC) voltage generated in the secondary winding, and outputs a DC output voltage; and
a controller that controls operation of the switch based on the DC output voltage.

9. A power supply, comprising:
the transformer according to claim 2;
a switch that intermittently applies a direct current (DC) input voltage to the primary winding;
a secondary-side rectifying and smoothing circuit that is connected to the secondary winding, rectifies and smoothes an alternating current (AC) voltage generated in the secondary winding, and outputs a DC output voltage; and
a controller that controls operation of the switch based on the DC output voltage.

10. The transformer according to claim 1,
wherein the primary winding and the secondary winding are fixed to the corresponding wall surfaces by adhesion using an adhesive that is thermally conductive.

11. The transformer according to claim 10, further comprising:
a heat dissipator that is wound and attached around an outer circumferential surface of the magnetic core.

12. A power supply, comprising:
the transformer according to claim 11;
a switch that intermittently applies a direct current (DC) input voltage to the primary winding;
a secondary-side rectifying and smoothing circuit that is connected to the secondary winding, rectifies and smoothes an alternating current (AC) voltage generated in the secondary winding, and outputs a DC output voltage; and
a controller that controls operation of the switch based on the DC output voltage.

13. A power supply, comprising:
the transformer according to claim 10;
a switch that intermittently applies a direct current (DC) input voltage to the primary winding;
a secondary-side rectifying and smoothing circuit that is connected to the secondary winding, rectifies and smoothes an alternating current (AC) voltage generated in the secondary winding, and outputs a DC output voltage; and
a controller that controls operation of the switch based on the DC output voltage.

14. The transformer according to claim 1, further comprising:
a heat dissipator that is wound and attached around an outer circumferential surface of the magnetic core.

15. A power supply, comprising:
the transformer according to claim 14;
a switch that intermittently applies a direct current (DC) input voltage to the primary winding;
a secondary-side rectifying and smoothing circuit that is connected to the secondary winding, rectifies and smoothes an alternating current (AC) voltage generated in the secondary winding, and outputs a DC output voltage; and
a controller that controls operation of the switch based on the DC output voltage.

16. A power supply, comprising:
the transformer according to claim 1;
a switch that intermittently applies a direct current (DC) input voltage to the primary winding;
a secondary-side rectifying and smoothing circuit that is connected to the secondary winding, rectifies and smoothes an alternating current (AC) voltage generated in the secondary winding, and outputs a DC output voltage; and
a controller that controls operation of the switch based on the DC output voltage.

17. A medical system, comprising:
the power supply according to claim 16 further including a pair of input terminals connected to an input line, a primary-side rectifying and smoothing circuit that is connected via a pair of power supply lines to the pair of input terminals, rectifies and smoothes an AC voltage inputted via the input line, the pair of input terminals, and the pair of power supply lines, and outputs to the switch as the DC input voltage, and a fuse or breaker interposed on the pair of power supply lines; and
a medical appliance that is connected downstream of the power supply and operates based on the DC output voltage from the power supply.

18. A medical system, comprising:
the power supply according to claim 16 further including a pair of input terminals connected to an input line and a primary-side rectifying and smoothing circuit that is connected to the pair of input terminals, rectifies and smoothes an AC voltage inputted via the input line and the pair of input terminals, and outputs as the DC input voltage to the switch;
a fuse or breaker interposed on the input line; and
a medical appliance that is connected downstream of the power supply and operates based on the DC output voltage from the power supply.

19. A medical system, comprising:
the power supply according to claim 16 further including a pair of input terminals connected to an input line, a primary-side rectifying and smoothing circuit that is connected to the pair of input terminals via a pair of power supply lines, rectifies and smoothes an AC voltage inputted via the input line, the pair of input terminals, and the pair of power supply lines and outputs as the DC input voltage to the switch, and a first fuse or first breaker interposed on one power supply line out of the pair of power supply lines;
a second fuse or second breaker interposed on the input line connected via the input terminal to another power supply line out of the pair of power supply lines; and
a medical appliance that is connected downstream of the power supply and operates based on the DC output voltage from the power supply.

* * * * *